United States Patent
Hovde et al.

(10) Patent No.: US 8,421,455 B1
(45) Date of Patent: Apr. 16, 2013

(54) PULSED FREE INDUCTION DECAY NONLINEAR MAGNETO-OPTICAL ROTATION APPARATUS

(75) Inventors: David Christian Hovde, Cincinnati, OH (US); Dmitry Budker, El Cerrito, CA (US); James Higbie, Lewisburg, PA (US); Victor Acosta, Albany, CA (US); Micah P. Ledbetter, Oakland, CA (US)

(73) Assignees: Southwest Sciences Incorporated, Santa Fe, NM (US); Regents of the University of California, Berkeley, CA (US)

( * ) Notice: Subject to any disclaimer, the term of this patent is extended or adjusted under 35 U.S.C. 154(b) by 809 days.

(21) Appl. No.: 12/567,452

(22) Filed: Sep. 25, 2009

Related U.S. Application Data

(60) Provisional application No. 61/100,632, filed on Sep. 26, 2008.

(51) Int. Cl.
*G01V 3/00* (2006.01)
*G01R 33/02* (2006.01)

(52) U.S. Cl.
USPC .................... 324/305; 324/301; 324/244.1

(58) Field of Classification Search ............... 324/244.1, 324/300–305
See application file for complete search history.

(56) References Cited

U.S. PATENT DOCUMENTS

| | | | |
|---|---|---|---|
| 5,189,368 A | 2/1993 | Chase | |
| 6,115,401 A * | 9/2000 | Scobey et al. | 372/100 |
| 6,472,869 B1 * | 10/2002 | Upschulte et al. | 324/304 |
| 7,008,559 B2 * | 3/2006 | Chen | 252/301.6 S |
| 7,038,450 B2 | 5/2006 | Romalis et al. | |
| 7,061,958 B2 * | 6/2006 | Krupke | 372/55 |
| 7,378,843 B2 | 5/2008 | Beranger | |
| 7,573,264 B2 | 8/2009 | Xu et al. | |
| 7,834,621 B2 * | 11/2010 | Anderson | 324/300 |
| 8,054,073 B2 * | 11/2011 | Tuchman | 324/301 |
| 8,054,074 B2 * | 11/2011 | Ichihara et al. | 324/304 |
| 8,264,693 B2 * | 9/2012 | Stoica et al. | 356/502 |
| 2004/0012388 A1 * | 1/2004 | Pedersen | 324/244.1 |
| 2007/0167723 A1 * | 7/2007 | Park et al. | 600/409 |
| 2007/0205767 A1 * | 9/2007 | Xu et al. | 324/304 |

FOREIGN PATENT DOCUMENTS

| | | |
|---|---|---|
| WO | WO 2009/073256 A2 | 6/2009 |
| WO | WO 2009/073736 A1 | 6/2009 |
| WO | WO 2009/073740 A2 | 6/2009 |
| WO | WO 2009/079054 A2 | 6/2009 |

OTHER PUBLICATIONS

Acosta, V. M. et al., "Production and detection of atomic hexadecapole at Earth's magnetic field", Cornell University Library arXiv.orq.http://arxiv.org/abs/0709.4283 Sep. 26, 2007.

Belfi, J. et al., "Dual channel self-oscillating optical magnetometer", Cornell University arXiv.org http://arxiv.org/abs/0812.1160 Dec. 5, 2008.

(Continued)

*Primary Examiner* — Joshua Benitez Rosario
(74) *Attorney, Agent, or Firm* — Jeffrey D. Myers; Peacock Myers, P.C.

(57) ABSTRACT

A magnetometer and concomitant magnetometry method comprising emitting light from a light source, via a pulse generator pulsing light from the light source, directing the pulsed light to an atomic chamber, employing a field sensor in the atomic chamber, and via a signal processing module receiving a signal from the field sensor.

35 Claims, 2 Drawing Sheets

OTHER PUBLICATIONS

Bell, William E. et al., "Optically Driven Spin Precession", *Physical Review Letters* vol. 6, No. 6 Mar. 15, 1961, 280-281.

Demtroder, Wolfgang, "Laser Spectroscopy, Basic Concepts and Instrumentation", Springer-Verlag 1988, 580-585.

Pustelny, S. et al., "Magnetometry Based on Nonlinear Magneto-Optical Rotation with Amplitude-Modulated Light", Cornell University arXiv.org http://arxiv.org/abs/0708.3488 Aug. 27, 2007.

Pustelny, S. et al., "Nonlinear Magneto-Optical Rotation with Modulated Light in Tilted Magnetic Fields", *Phy Rev A* 74, 063420 2006.

Xu, Shoujun et al., "Construction and applications of an atomic magnetic gradiometer based on nonlinear magneto-optical rotation", *Review of Scientific Instruments* vol. 77, American Institute of Physics 2006, 083106-1-083106-2.

\* cited by examiner

PULSED FREE INDUCTION DECAY NONLINEAR MAGNETO-OPTICAL ROTATION APPARATUS

CROSS-REFERENCE TO RELATED APPLICATIONS

This application claims priority to and the benefit of the filing of U.S. Provisional Patent Application Ser. No. 61/100,632, entitled "Pulsed Free Induction Decay Nonlinear Magneto-Optical Rotation Apparatus", filed on Sep. 26, 2008, and the specification and claims thereof are incorporated herein by reference.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Contract No. N68335-06-C-0042 awarded by the U.S. Department of the Navy.

INCORPORATION BY REFERENCE OF MATERIAL SUBMITTED ON A COMPACT DISC

Not Applicable.

COPYRIGHTED MATERIAL

Not Applicable.

BACKGROUND OF THE INVENTION

1. Field of the Invention (Technical Field)

The present invention relates to magnetometers, and specifically to pulsed free induction decay nonlinear magneto-optical rotation (NMOR) magnetometers and corresponding methods.

2. Description of Related Art

Sensitive magnetometers are important in a variety of fields, including defense applications such as submarine detection and mineral exploration. Atomic magnetometers feature high sensitivity to the magnitude of the total magnetic field, making them easier to deploy because the signal is almost independent of the orientation of the sensor with respect to the field. A number of companies manufacture atomic magnetometers, including cesium magnetometers by Geometrics (San Jose, Calif.) and Scintrex (Concord, Ontario Canada) and potassium magnetometer by GEM Systems (Markham, Ontario Canada). These commercial magnetometers are based on the original work of Bell and Bloom [W. Bell and A. Bloom, "Optically driven spin precession," Phys. Rev. Lett. 6, 280-281 (1961).] In such magnetometers, visible or near-infared radiation is applied to an atomic vapor with the wavelength chosen to be resonant with one of the allowed electronic transitions. The optical radiation polarizes the atoms. A radiofrequency (RF) field is also applied. When the frequency of the RF field is resonant with the Larmor frequency of the atoms, the field induces transitions among the magnetic sublevels, such that the optical properties of the atomic vapor are changed. A change in transmission can be observed. These magnetometers typically achieve a sensitivity of 1 to 10 picoTesla in a 1 Hz bandwidth. In addition, the RF field has a long wavelength and thus is difficult to confine to the atomic vapor. When such magnetometers are placed in close proximity it is possible for the RF field from one device to influence the performance of the neighboring device, possibly degrading the accuracy with which the field is measured.

In addition to observing spectroscopic transitions among the magnetic sublevels in the frequency domain, it is possible to observe the transitions in the time domain. When a sample is excited with a pulse, a damped oscillation decay signal known as free induction decay (FID) can result. The oscillation frequency has information equivalent to the transition frequencies of the spectrum observed the frequency domain, and the damping envelope has information equivalent to the width of the transition in the frequency domain. FID is known in nuclear magnetic resonance (NMR) and optical spectroscopy. See, e.g., W. Demtroder, Laser Spectroscopy, Basic Concepts and Instrumentation, 3rd ed, Springer Verlag, New York (1988), pp. 580 ff.

Nonlinear magneto-optical rotation (NMOR) is a recently developed technique for measuring magnetic fields with high sensitivity. A typical NMOR apparatus includes a low pressure cell that contains atomic vapor and that has at least one window for admitting light to atoms and for transferring light to a detector. The apparatus also includes a linearly polarized light source that can be tuned to a spectral feature of the atomic vapor. Polarizers for analyzing the light transmitted through the atomic vapor, and photo-detectors for converting light intensity to an electrical signal are also included. The cell is a glass bulb or a glass tube, the inner surfaces of which are treated with a hydrocarbon to suppress wall relaxations. The light source is a diode laser. The photodetector is a photodiode. Fiber optics deliver the light beam and receive the return beam.

FIG. 1 illustrates a schematic diagram of a known amplitude-modulated (AM)-NMOR apparatus. In this diagram, a diode laser is used as a light source. The wavelength of the laser is stabilized at a target point on the spectral feature. A dichroic atomic vapor line locking apparatus (DAVLL) is used for stabilization. Separate pump and probe beams are used, and the amplitude of the pump beam is modulated with a Mach-Zender modulator (MZM). A magnetic-field probe comprises an atomic vapor sample in an anti-relaxation-coated glass cell, and also comprises polarization optics for defining the polarization of the probe beam and analyzing it. The detection scheme can be differential detection as illustrated in FIG. 1, or a single detector can be used. Better sensitivity is usually obtained when the analyzing polarizer is set so that equal optical power falls on two detectors, so that their difference measures the time-dependent polarization rotation while cancelling laser amplitude noise. When a single detector is used, the analyzing polarizer is set at a point that balances detector noise and source noise.

When a light source is tuned to an atomic spectral feature, the light source pumps the atoms in the cell, causing an alignment of the atoms as a result of coherence between the magnetic sublevels of the ground state. In one NMOR technique, a laser is operated continuously, which is capable of measuring fields only when they are very close to zero. The Larmor precession frequency is less than the relaxation rate. For typical relaxation rates of about 10 s$^{-1}$ and tuning rates of about 10 Hz/nT, the measurement range is about 1 nT.

Both frequency-modulated NMOR (FM-NMOR) and amplitude modulated NMOR (AM-NMOR) are available modulation techniques. These modulation techniques can be used to measure higher magnetic fields, at least up to Earth's field and well beyond, by using stroboscopic pumping of the atoms. However, in FM-NMOR and AM-NMOR the modulation frequency is carefully matched to the Larmor precession frequency of the atomic sample or one of its harmonics, typically within about 1/relaxation rate. S. Pustelny et al., "Nonlinear magneto-optical rotation with modulated light in tilted magnetic fields", *Phys. Rev. A* 74, 063420 (2006). Such matching is accomplished by tuning the modulation frequency or by operating the magnetometer in a self-oscillating configuration. However, the need to precisely match the modulation frequency is a problem when measuring the magnetic field at several points, as in a gradiometer or an array detector, because typical spatial variations in the magnetic field over distances of one meter result in Larmor frequencies that differ by more than a typical line width of 1 nT. WO 2009/073256 describes the measurement of magnetic fields by NMOR using modulation of the frequency or amplitude of a light source. However, the modulation itself is continuous. The modulation frequency must be closely matched (typically, to within less than 10 Hz) to a harmonic of the Larmor frequency. A separate modulator is needed for each measurement point. This can add significant cost and complexity to the system. In addition, technical problems can arise. When two channels are used to measure a gradient by self-oscillating AM NMOR, inadvertent locking of the two channels can occur as a result of coherent electrical noise.

U.S. Pat. No. 7,573,264 and WO 2009/079054 describe a method and apparatus for detecting RF fields, including the free induction decay magnetic field generated by a sample. The invention applies RF pulses to the nuclei of a sample under study. However, the magnetometer itself operates with continuous modulation, which must be matched to a harmonic of the Larmor frequency. This prior art does not disclose means for creating a single optical pulse or a short burst of optical pulses to excite the atoms in the magnetometer. As a result, if it is desired to measure fields at a number of locations simultaneously, then each measurement point would need to be provided with its own modulation means.

Additional arguably related references are next discussed. WO 2009/073740 and WO 2009/073736 disclose a technique for manipulating spins in a solid state lattice. Like a Bell-Bloom magnetometer, both an optical field and an RF field are required. RF pulses control the spins, while a laser reads out the spin state. Separate RF pulses are polarized along x and y.

More recently, all-optical magnetometers have been introduced in the laboratory. These include spin-exchange-relaxation free (SERF) magnetometers (U.S. Pat. No. 7,038,450). SERF magnetometers achieve high sensitivity but require high sample temperature to achieve a high density of atoms. SERF magnetometers also operate at relatively low magnetic fields (less than 0.1 microTesla), so that operation at fields typical of Earth's surface (20-80 microTelsa) requires the use of a stable magnetic field which can reduce Earth's field to a level where the magnetometer can operate.

Pulsed excitation has also been used to improve the performance of a fluxgate magnetometer. U.S. Pat. No. 7,378,843. The fluxgate magnetometer is a different measurement approach from atomic magnetometers. The fluxgate includes a magnetic core and at least one plurality of windings. Pulses of electric current of either a positive or alternating sign are applied to one of the windings. The pulse frequency can be chosen arbitrarily to optimize the bandwidth. The FID decay of the resulting signal cannot be used to measure the magnetic field by analyzing its frequency content. The calibration of the fluxgate magnetometer depends on the calibration of the windings and of the current pulse.

The present invention is an optical magnetometer that does not require RF fields, so that two magnetometers can be placed in close proximity without cross-talk between the readings. The magnetometer does not require reducing the magnetic field below the value typical of Earth's surface. The burst period need not closely match the Larmor frequency, so it is possible to measure magnetic fields at a number of points using a single modulation means. The measurement of the magnetic field depends on the properties of the atomic vapor, resulting in stable calibration.

There is currently a need for an NMOR that does not have the inherent problems of the NMOR techniques discussed above. Embodiments of the present invention solve these problems.

BRIEF SUMMARY OF THE INVENTION

The present invention is of a magnetometer and concomitant magnetometry method, comprising: emitting light from a light source; via a pulse generator, pulsing light from the light source; directing the pulsed light to an atomic chamber; employing a field sensor in the atomic chamber; and via a signal processing module, receiving a signal from the field sensor. In the preferred embodiments, the pulsed light is linearly polarized. The field sensor comprises an atomic vapor selected from lithium, sodium, rubidium, and cesium. Preferred light sources are a dye laser, a diode laser, a distributed feedback laser, and/or a vertical cavity surface emitting laser. A single light path can be employed. The pulsed light can be amplitude, frequency, and/or wavelength modulated. The pulse generator preferably uses a pulse duration shorter than approximately $\frac{1}{4}$ of the Larmor precession period of atoms in the atomic chamber, and in one embodiment produces a succession of pulses during a pump period, the time between pulses being about equal to $\frac{1}{2}$ the Larmor precession period or integer multiples thereof. The pulse generator in another embodiment produces a succession of one or more pulses during a pump period and is operated at a stable level during a probe period. The signal processing module comprises a balanced polarimeter, two photodetectors, and a difference amplifier. Alternatively, the signal processing module comprises a nearly crossed polarimeter and a single photodetector. Preferably, the signal processing module comprises a sensor of fluorescence from the field sensor and employs a probe beam, most preferably a linearly polarized probe beam.

The present invention is also of a magnetometer (and concomitant magnetometry method), comprising: a pulsed light source; a continuous-wave light source; a pulse generator permitting pulsing of light from said pulsed light source; a path for said pulsed light to travel to an atomic chamber; a path for said continuous-wave light to travel to said atomic chamber; a field sensor generating an optical signal in said atomic chamber; a signal processing module receiving said optical signal from said field sensor; and a path for said optical signal to travel to said signal processing module.

Further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention.

The drawings are only for the purpose of illustrating one or more preferred embodiments of the invention and are not to be construed as limiting the invention. In the drawings.

DETAILED DESCRIPTION OF THE INVENTION

The present invention is of a free induction decay NMOR (FID NMOR) and concomitant methods. Advantages of FID NMOR include but are not limited to:

No broadening from the pump beam during the probing sequence, hence, high pumping power creates a stronger signal, without increasing the relaxation rate.

One beam can be used as both pump and probe, without adverse modulation effects on the probe beam.

Pumping can use AM modulation, FM modulation and/or tone burst modulation.

Pumping can be accomplished in a single pulse (if sufficient power is available) or in a series of pulses, each of lower power.

Detection can be accomplished by monitoring fluorescent light emitted from the atoms while the pump beam is off.

Pump and probe lasers can propagate in the same direction without the need to spatially separate them. This is useful for remote excitation and probing of NMOR signals.

Figure 4:
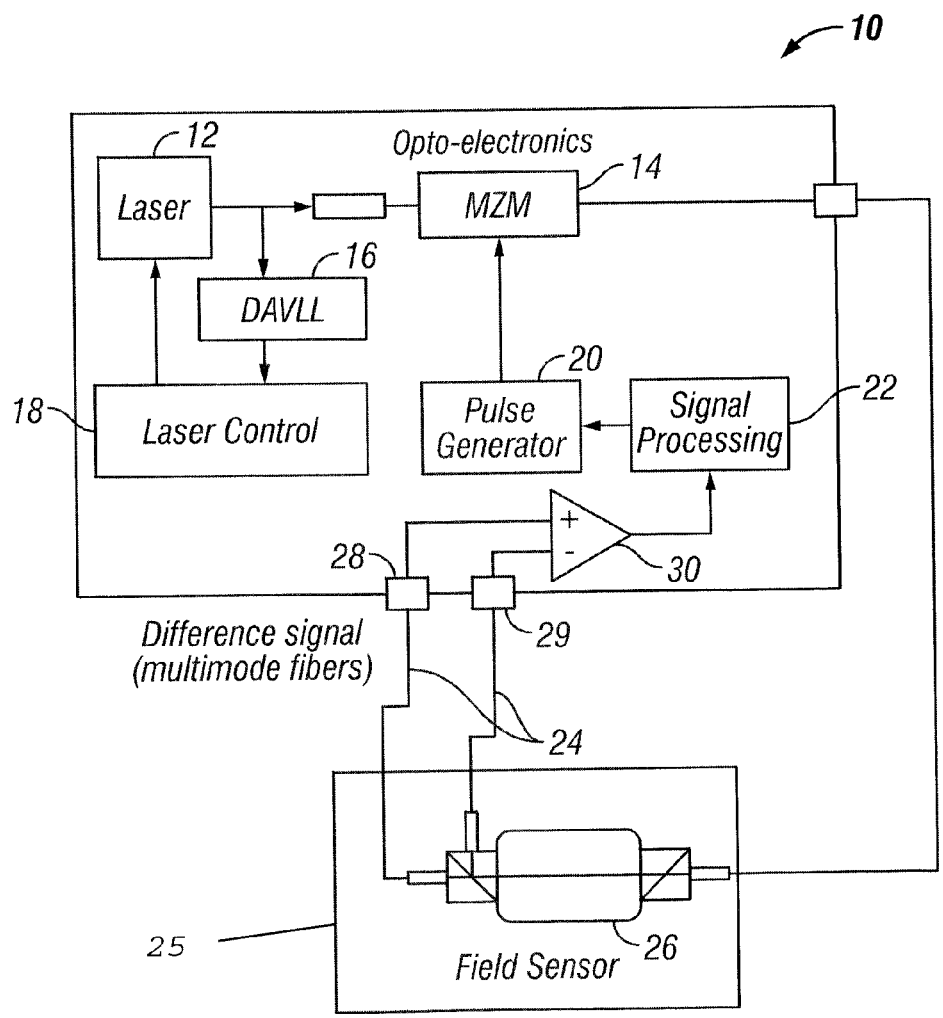
FIG. 4 is a schematic diagram of an embodiment of the present invention comprising a free induction decay (FID) NMOR magnetometer.

In one embodiment of the present invention and as illustrated in FIG. 4, an FID NMOR apparatus 10 provides light beams, preferably linearly-polarized, for pumping and probing atoms and atomic vapor. The apparatus comprises laser 12, MZM 14, DAVLL 16, laser control 18, pulse generator 20, signal processing module 22, difference signal (multimode fibers) 24, photodiodes 28,29, difference amplifier 30, and field sensor 26 within polarimeter 25. The FID NMOR also comprises a method of pulsed excitation (several methods are described below) and a digitizer that can preferably digitize the free-induction decay for processing by a Fourier transform or other algorithm that can recover the Larmor frequency. A lock-in amplifier is not required for the FID NMOR of this embodiment. Instead, it has been replaced with a more general signal processing module 22. In this embodiment, a beam is preferably used to deliver the light used to pump and probe the atomic vapor. The AM-NMOR requires at least two beams to deliver the light used to pump and probe the atomic vapor.

In another embodiment of the present invention, the simplest method of pulsed excitation is preferably a pulsed laser such as a pulsed dye laser. An example is the Sirah laser system from Newport, which can produce approximately 10 mJ pulses of less than 1.2 GHz line width. If this laser is tuned near an atomic absorption feature of Rb, it preferably excites many atoms. Atoms whose transition moments are aligned with the polarization vector of the pump laser's electric field are either driven by Rabi oscillations or are spontaneously emitted back to the ground state in a short time. In this embodiment, the pump pulse leads to the creation of coherence among the magnetic sublevels of the ground state. This coherence preferably evolves at the Larmor frequency, as for AM-NMOR and FM-NMOR. However, unlike AM-NMOR or FM-NMOR, the pumping stops, and the coherence decays. A continuous probe laser beam that is linearly polarized preferably has its polarization state changed as a function of the Larmor precession of the atomic coherence. The damped decay preferably looks like the exponentially damped sine wave as illustrated in FIG. 2.

Figure 1:
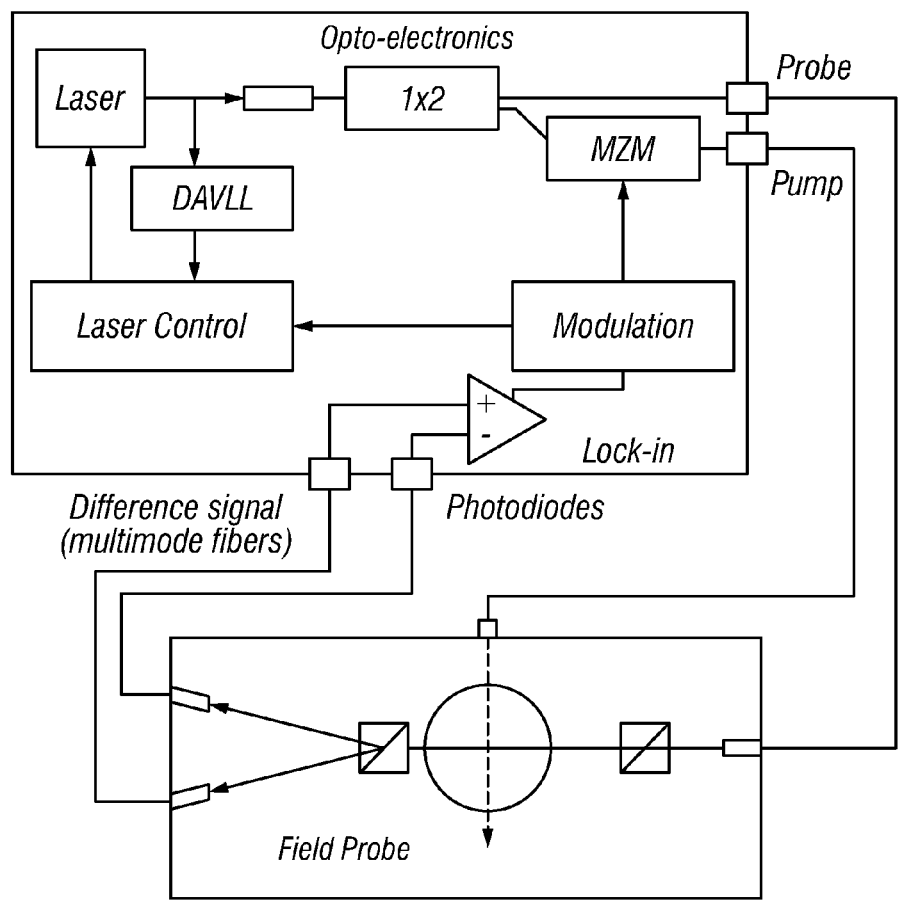
FIG. 1 is a schematic diagram of an amplitude modulated NMOR magnetometer.
Figure 2:
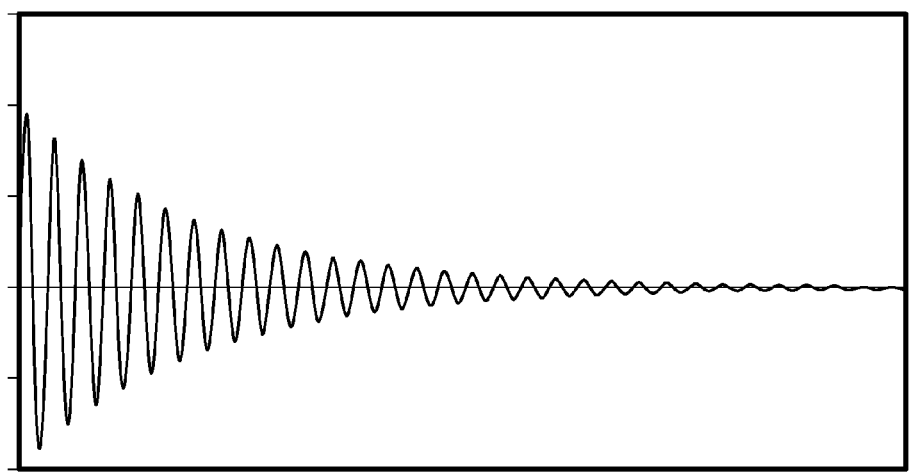
FIG. 2 illustrates a damped exponential signal expected for a single pump pulse.

Referring to FIG. 2, the damped exponential is characterized by the frequency of the sine wave and the exponential decay rate. In FIG. 2, the ratio is about 10:1, chosen to make the illustration clear. The invention applies to a wide range of ratios of sine wave and exponential decay. The geophysical field on Earth's surface is in the range of approximately $\mu T$, for which the Larmor frequency is in the range of approximately 100 kHz to 1 MHz for alkali atoms, whereas an antirelaxation coated atomic vapor cell has a decay rate of about 1 to 100 per second, for a ratio of approximately 1,000:1 to 1,000,000:1. To picture such a free-induction decay, the oscillations are drawn extremely close to one another.

Although using a pulsed excitation source such as a dye laser is easy to do in the laboratory, for many applications, it is better to use a much smaller, less expensive, but lower-power source such as a diode laser. Possible lasers for an embodiment of the present invention include, but are not limited to, distributed feedback (DFB) lasers with output power of several hundred mW and vertical cavity surface emitting lasers (VCSELs) with output power of a few mW. For an AM-NMOR magnetometer, the optimum pump power is in the range of 10 to 5000 $\mu W$, for a total energy of 1 to 100 pJ in the approximately 0.001 to 1 second lifetime of the coherence. In accordance with an embodiment of the present invention, delivering the same energy in a pulse equal to ¼ the Larmor period at Earth's field requires a power of approximately 10 $\mu J$/3 $\mu s$=2 to 1000 W. This exceeds the peak power available from most diode lasers, especially when optical fibers are used to deliver the light to the sample. Using a pulse duration longer than ¼ the Larmor period unpumps the coherence.

In one embodiment of the present invention, an effective optical coherence can be created by using multiple optical pulses, each of which is shorter than ¼ the Larmor period, and which are separated in time by an interval equal to or substantially equal to ½ the Larmor period. For example, a chain of about 1000 such pulses requires a peak power of about 2 to 1000 mW. This is well within the range that can be provided by commercial single frequency diode lasers. Although the pulses of this embodiment preferably match the Larmor frequency, this matching is greatly relaxed compared to AM-NMOR or FM-NMOR because the 1000 pulses occur in a much shorter time interval of about 3.3 ms, versus the 100 ms coherence lifetime.

The optimum pump power in AM-NMOR and FM-NMOR results from a compromise between creating a high degree of atomic coherence (demanding high power) and maximizing the lifetime of the coherence to provide a narrow resonance width (demanding low power). In an FID NMOR in accordance with an embodiment of the present invention, the coherence is preferably measured when the pump field is off, so it is possible to use stronger pump fields and thereby achieve stronger coherence, without the penalty of a broadened resonance. Broadening has the effect of reducing the sensitivity to the magnetic field.

Figure 3:
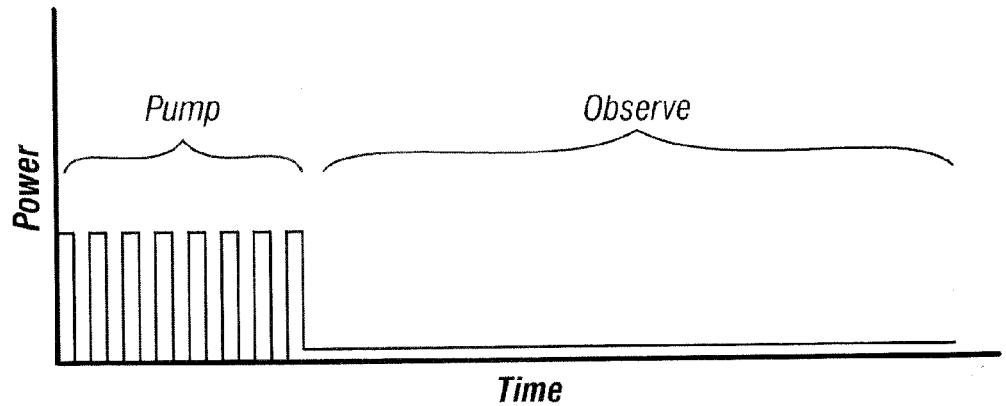
FIG. 3 illustrates a timing diagram comprising a pump sequence followed by a probe sequence during which the free induction decay is observed by its modulation of the polarization of the beam.

Using separate modulated pump and unmodulated probe beams provides an advantage in AM-NMOR and FM-NMOR, in that the signal detected at the Larmor frequency or one of its harmonics by the probe beam is almost completely free from background effects. The origin of these background effects is unclear, but they become stronger as the field increases into the geophysical range, and they may be related to other magnetic rotation phenomena. The same background suppression advantage can be obtained in an embodiment of the present invention by using a single beam in an FID NMOR. Using one beam makes it easier to use fiber optics to deliver the light to the atomic probe (only one fiber is required), and it also preferably guarantees the alignment of the polarization axis of the pump and probe beams. The pump and probe functions can be separated in time, as illustrated in FIG. 3. The pump beam is preferably pulsed between a peak power level and zero. The same beam is adjusted to a low light level to act as the probe beam during the observation time. The detector sees the intense pump pulses, and then recovers to measure the weak probe beam.

Another embodiment of the present invention uses wavelength or frequency modulation of the pump light as another measurement approach. With this approach, the amplitude of the pump laser is preferably kept approximately constant, and the wavelength (frequency) of the laser is modulated onto and off of the spectral feature, thus turning on and off the optical pumping. Similar to the amplitude modulated case, the wavelength is preferably tuned on resonance just once or it is swept through the resonance a number of times, and then swept off resonance to record the free induction decay. Tone burst modulation can also be used. With this approach, the laser frequency is preferably modulated at some high frequency, much higher than the Larmor frequency, creating one or more sidebands on the laser carrier frequency. Some of the sidebands overlap the spectral transition of the atoms. The modulation is turned on and off. When the modulation is on, the side bands that overlap the spectral transition pump the atomic vapor. As before, the pumping can be a single pulse or a series of pulses timed to the Larmor frequency.

Yet another embodiment of this invention comprises free space remote detection of magnetic fields. This method preferably comprises an atomic vapor cell and a non-magnetic retro-reflector deployed at a measurement site. A pump, a probe laser, a detector, and a polarizer are preferably located remotely. The pump and probe beams can over-fill the atomic vapor cell for ease of alignment. Under these conditions, the return paths of the pump and probe beams preferably overlap spatially. Using a pulsed FID measurement in accordance with the embodiments of this invention allows the beams to be separated in time, simplifying the requirements for filtering out the pump light. A further embodiment of the present invention comprises using the same beam as both pump and probe, with a temporal profile chosen to maximize the creation of the coherence in the pumping part of the cycle, then optimize the magnetic sensitivity in the observing part of the cycle, as illustrated in FIG. 3.

Note that in the specification and claims, "about" or "approximately" means within twenty percent (20%) of the numerical amount cited.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A magnetometer comprising:
    a light source;
    a pulse generator permitting pulsing of light from said light source;
    a path for the pulsed light to travel to an atomic chamber;
    a field sensor in said atomic chamber; and
    a signal processing module receiving a signal from said field sensor; and
    wherein said magnetometer does not employ a means for applying a magnetic field to said atomic chamber.

2. The magnetometer of claim 1 wherein said pulsed light is linearly polarized.

3. The magnetometer of claim 1 wherein said field sensor comprises an atomic vapor selected from the group consisting of lithium, sodium, rubidium, and cesium.

4. The magnetometer of claim 1 wherein said light source is a dye laser.

5. The magnetometer of claim 1 wherein said light source is a diode laser.

6. The magnetometer of claim 1 wherein said light source is a distributed feedback laser.

7. The magnetometer of claim 1 wherein said light source is a vertical cavity surface emitting laser.

8. The magnetometer of claim 1 wherein said path is a single path.

9. The magnetometer of claim 1 wherein said pulsed light is amplitude, frequency, or wavelength modulated.

10. The magnetometer of claim 1 wherein said pulse generator uses a pulse duration shorter than approximately ¼ of the Larmor precession period of atoms in said atomic chamber.

11. The magnetometer of claim 10 wherein said pulse generator produces a succession of pulses during a pump period, the time between pulses being about equal to ½ the Larmor precession period or integer multiples thereof.

12. The magnetometer of claim 1 wherein said pulse generator produces a succession of one or more pulses during a pump period and is operated at a stable level during a probe period.

13. The magnetometer of claim 1 wherein said signal processing module comprises a balanced polarimeter, two photodetectors, and a difference amplifier.

14. The magnetometer of claim 1 wherein said signal processing module comprises a nearly crossed polarimeter and a single photodetector.

15. The magnetometer of claim 1 wherein said signal processing module comprises a sensor of fluorescence from said field sensor.

16. The magnetometer of claim 1 wherein said signal processing module employs a probe beam.

17. The magnetometer of claim 16 wherein said signal processing module employs a linearly polarized probe beam.

18. A magnetometry method comprising the steps of:
    emitting light from a light source;
    via a pulse generator, pulsing light from the light source;
    directing the pulsed light to an atomic chamber;
    employing a field sensor in the atomic chamber; and
    via a signal processing module, receiving a signal from the field sensor; and
    wherein the method does not apply a magnetic field to the atomic chamber.

19. The method of claim 18 additionally comprising the step of linearly polarizing the pulsed light.

20. The method of claim 18 wherein the field sensor comprises an atomic vapor selected from the group consisting of lithium, sodium, rubidium, and cesium.

21. The method of claim 18 wherein the light source is a dye laser.

22. The method of claim 18 wherein the light source is a diode laser.

23. The method of claim 18 wherein the light source is a distributed feedback laser.

24. The method of claim 18 wherein the light source is a vertical cavity surface emitting laser.

25. The method of claim 18 wherein the directing step employs a single path.

26. The method of claim 18 additionally comprising the step of amplitude, frequency, or wavelength modulating the pulsed light.

27. The method of claim 18 wherein the pulse generator uses a pulse duration shorter than approximately ¼ of the Larmor precession period of atoms in the atomic chamber.

28. The method of claim 27 wherein the pulse generator produces a succession of pulses during a pump period, the time between pulses being about equal to ½ the Larmor precession period or integer multiples thereof.

29. The method of claim 18 wherein the pulse generator produces a succession of one or more pulses during a pump period and is operated at a stable level during a probe period.

30. The method of claim 18 wherein the signal processing module comprises a balanced polarimeter, two photodetectors, and a difference amplifier.

31. The method of claim 18 wherein the signal processing module comprises a nearly crossed polarimeter and a single photodetector.

32. The method of claim 18 wherein the signal processing module comprises a sensor of fluorescence from the field sensor.

33. The method of claim 18 wherein the signal processing module employs a probe beam.

34. The method of claim 33 wherein the signal processing module employs a linearly polarized probe beam.

35. A magnetometer comprising:

a pulsed light source;

a continuous-wave light source;

a pulse generator permitting pulsing of light from said pulsed light source;

a path for said pulsed light to travel to an atomic chamber;

a path for said continuous-wave light to travel to said atomic chamber;

a field sensor generating an optical signal in said atomic chamber;

a signal processing module receiving said optical signal from said field sensor; and a path for said optical signal to travel to said signal processing modulei and wherein said magnetometer does not employ a means for applying a magnetic field to said atomic chamber.

* * * * *